(12) United States Patent
Sugawara et al.

(10) Patent No.: US 11,053,606 B2
(45) Date of Patent: Jul. 6, 2021

(54) METHOD OF PRODUCING SILICON SINGLE CRYSTAL, AND SILICON SINGLE CRYSTAL WAFER

(71) Applicant: SHIN-ETSU HANDOTAI CO., LTD., Tokyo (JP)

(72) Inventors: Kosei Sugawara, Nishigo-mura (JP); Ryoji Hoshi, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 3 days.

(21) Appl. No.: 16/463,537

(22) PCT Filed: Nov. 13, 2017

(86) PCT No.: PCT/JP2017/040698
§ 371 (c)(1),
(2) Date: May 23, 2019

(87) PCT Pub. No.: WO2018/105317
PCT Pub. Date: Jun. 14, 2018

(65) Prior Publication Data
US 2019/0376205 A1    Dec. 12, 2019

(30) Foreign Application Priority Data
Dec. 9, 2016 (JP) .............................. JP2016-238941

(51) Int. Cl.
*C30B 15/10* (2006.01)
*C30B 15/20* (2006.01)
*C30B 29/06* (2006.01)

(52) U.S. Cl.
CPC .............. *C30B 15/20* (2013.01); *C30B 29/06* (2013.01)

(58) Field of Classification Search
CPC .......... C30B 15/02; C30B 15/10; C30B 29/04
See application file for complete search history.

(56) References Cited

U.S. PATENT DOCUMENTS 6,858,094 B2 * 2/2005 Qu ......................... C30B 29/06
148/33.5
8,492,243 B2 * 7/2013 Haeberlen ......... H01L 21/26506
438/455
(Continued)

FOREIGN PATENT DOCUMENTS

JP   H05-194078 A   8/1993
JP   H05-208892 A   8/1993
(Continued)

OTHER PUBLICATIONS

Miyazawa, Nobutaro, Melt Seicho-no Dynamics, Kyoritsu Shuppan, (2002).
(Continued)

*Primary Examiner* — Robert M Kunemund
(74) *Attorney, Agent, or Firm* — Oliff PLC

(57) ABSTRACT

A method of producing a silicon single crystal, including pulling a silicon single crystal by Czochralski method while a magnetic field is applied to a raw material melt, including: setting a diameter on pulling the silicon single crystal to 300 mm or more, setting a growth axis direction of the silicon single crystal to <111>, and growing the silicon single crystal so as to satisfy a relation of $1096/D-(0.134\times M+80\times R)/D>0.7$, wherein D [mm] is the diameter on pulling the silicon single crystal, M [Gauss] is a central magnetic field strength at a surface of the raw material melt, and R [rpm] is a rotation rate of the silicon single crystal. This makes it possible to produce a <111> crystal with favorable macroscopic RRG distribution and microscopic variation of resistivity.

4 Claims, 3 Drawing Sheets

(56) References Cited

U.S. PATENT DOCUMENTS

| | | | |
|---|---|---|---|
| 8,888,911 B2* | 11/2014 | Uto | C30B 15/20 |
| | | | 117/35 |
| 2004/0003769 A1* | 1/2004 | Tamatsuka | C30B 33/00 |
| | | | 117/13 |
| 2004/0005777 A1* | 1/2004 | Qu | C30B 29/06 |
| | | | 438/689 |
| 2010/0221869 A1 | 9/2010 | Schroeder et al. | |
| 2010/0291756 A1 | 11/2010 | Haeberlen et al. | |
| 2011/0163313 A1* | 7/2011 | Seacrist | H01L 29/06 |
| | | | 257/48 |
| 2013/0337601 A1 | 12/2013 | Kapur et al. | |
| 2016/0126318 A1* | 5/2016 | Sakurada | C30B 29/68 |
| | | | 428/336 |

FOREIGN PATENT DOCUMENTS

| | | |
|---|---|---|
| JP | H06-263583 A | 9/1994 |
| JP | H07-277870 A | 10/1995 |
| JP | H07-277891 A | 10/1995 |
| JP | H11-186121 A | 7/1999 |
| JP | 2003-002784 A | 1/2003 |
| JP | 2013-028476 A | 2/2013 |
| JP | 2013-102212 A | 5/2013 |
| JP | 2015-513518 A | 5/2015 |
| JP | 2016-117603 A | 6/2016 |

OTHER PUBLICATIONS

Simura, Fumio, Semiconductor Silicon Crystal Technology, Academic Press. Inc., (1989).

Jan. 23, 2018 Search Report issued in International Patent Application No. PCT/JP2017/040698.

Sep. 22, 2020 Office Action issued in Chinese Patent Application No. 201780075050.8.

Jan. 25, 2021 Office Action issued in Chinese Patent Application No. 201780075050.8.

Apr. 12, 2021 Office Action issued in Chinese Patent Application No. 201780075050.8.

* cited by examiner

METHOD OF PRODUCING SILICON SINGLE CRYSTAL, AND SILICON SINGLE CRYSTAL WAFER

TECHNICAL FIELD

The present invention relates to a method of producing a large diameter <111> silicon single crystal by Czochralski method while applying a magnetic field and a silicon single crystal wafer.

BACKGROUND ART

Si transistors are almost pushed to the limit in improving the properties by miniaturization and high integration. Dramatic improvement of the properties has been expected from next-generation transistors using Ge or a III-V group compound semiconductor, which are superior in carrier mobility to Si, as a channel material.

These next-generation channel materials are deficient in the amounts of resources such that the content of Ge is 1.8 ppma, the contents of Ga and As are 18 ppma and 1.5 ppma respectively in the crust unlike Si, the content of which is 27.7% of the crust. Additionally, compound semiconductors such as GaAs are brittle and liable to break as well as poor in heat conduction, which is one of the issues for industrial uses.

These issues can be solved by means of a hetero structure in which Ge, GaAs, etc. is/are disposed on an Si substrate, which is full in resource, low cost, high quality, and fully used for electron devises.

In forming these layers of different kind of atom on an Si substrate, however, there arise issues of (1) introducing a misfit dislocation due to lattice constant mismatch, (2) residual stress, dislocation, and warpage of a wafer caused by thermal distortion in a film due to the difference of thermal expansion coefficient, and (3) generating Anti-phase domain due to the difference of polarity between nonpolar Si and III-V groups composed of different elements to have polarity.

Among these issues, it has been known that the misfit dislocation in a grown layer of different atoms can be controlled substantially by the method called selective area growth, in which an Si substrate is coated with $SiO_2$ and so on, followed by growth from the partly exposed surface of the Si substrate.

It has been known that the influence of the difference of thermal expansion coefficient can be decreased by lowering the growth temperature, but lowering of temperature causes abuse of deteriorating crystallinity. Accordingly, this issue is effectively treated with a method for growth in a pattern formed from $SiO_2$ and so on or lateral growth via a pattern because Si and the layer of different atom(s) are separated to remove mutual influence due to thermal expansion.

These methods make it possible to control the influence of thermal expansion coefficient substantially, but fail to prevent the influence of the difference of thermal expansion coefficient on a growth plane in the pattern. Additionally, introduction of distortion into a channel portion also provides an advantageous point to enhance the carrier mobility. Accordingly, a wafer is preferable to be strong in itself and capable of reducing dislocation and wafer warpage. In this point, the Si (111) plane is superior to other plane orientations because it is a close-packed plane to have maximum mechanical strength and can prevent dislocation or warpage of a wafer.

It has been known that the Anti-phase domain can be controlled by providing a substrate surface with a step of even atoms. In case of growing on a (100) substrate, a method of using an off-angle substrate and so on are useful. Also in this point, it is not necessary to adjust off-angle and so on in the Si (111) plane because it is a diatomic layer step originally.

As described above, in the hetero structure in which material with higher carrier mobility is epitaxially grown on an Si substrate, the Si (111) plane is superior to other plane orientations of Si in mechanical strength, which brings to control dislocation and warpage of a wafer due to the difference of thermal expansion coefficient, and in the surface of diatomic layer step, which brings to control Anti-phase domain.

As described above, the Si (111) plane is predominant as a substrate for hetero epitaxial, which is a next-generation channel material. In MOS transistors of current mainstream using Si as a channel material, however, high-speed operation of a MOS transistor is hindered by the interface level at the interface of $Si(111)$-$SiO_2$. Accordingly, it has not been used a silicon single crystal wafer that has been cut out from a silicon single crystal with crystal orientation of <111> (hereinafter, also referred to as a (111) silicon wafer). Therefore, the (111) silicon wafer has never been used industrially or practically as a large diameter water with a diameter of 300 mm or more, which can be subjected to cutting-edge miniaturization techniques with high yield. In production of a silicon single crystal, actually, it has never been reported an example of growing a silicon single crystal with a crystal orientation of <111> (hereinafter, also referred to as a <111> crystal) having a large diameter of 300 mm or more.

Accordingly, the plane quality of (111) silicon wafer has not been fully investigated for cutting-edge devises made by a minute design rule.

Regarding the plane quality of previous (111) silicon wafers, it is known that lateral growth (facet growth) occurs when the solid-liquid growth interface becomes flat and gets close to the (111) plane as described in Non-Patent Document 1, for example. Such a lateral growth portion contained in a plane causes worsening of the radial distribution of resistivity (RRG) in (111) silicon wafers than in (100) silicon wafers as described in Non-Patent Document 2.

Due to this lateral growth, which is characteristic in <111> crystal growth, and worsening of the RRG distribution resulted therefrom, the previous arts have unanimously tried to avoid lateral growth.

For example, Patent Document 1 discloses a technique of preventing lateral growth by rotating a crystal in variable rate to promote convection near the solid-liquid growth interface due to the rotation of the crystal. Patent Document 2 discloses a technique of preventing lateral growth by tilting the growing axis by 1 to 6° from <111>. Patent Document 3 discloses a technique of preventing lateral growth by Double Layer CZ (DLCZ) method, in which a solid layer is formed under the melt layer in a crucible.

In virtue of preventing lateral growth by crystal rotation to promote convection described in Patent Document 1, the macroscopic distribution is improved, but the microscopic distribution is worsened because temperature change is liable to occur due to convection at the solid-liquid interface. Additionally, the method of Patent Document 2 is less effective for large improvement because lateral growth occurs along the tilted (111) plane. On the other hand, Patent Document 3 makes the solid-liquid interface flat by DLCZ method, but the DLCZ method causes an abuse of deteriorating the microscopic distribution of resistivity as described in Patent Document 4.

CITATION LIST

Patent Literature

Patent Document 1: Japanese Unexamined Patent Publication (Kokai) No. H05-208892
Patent Document 2: Japanese Unexamined Patent Publication (Kokai) No. H11-186121
Patent Document 3: Japanese Unexamined Patent Publication (Kokai) No. H07-277870
Patent Document 4: Japanese Unexamined Patent Publication (Kokai) No. H06-263583

NON-PATENT LITERATURE

Non Patent Document 1: Melt Seicho-no Dynamics, edited by Nobutaro Miyazawa (2002), Kyoritsu Shuppan
Non Patent Document 2: Simura (1989), Semiconductor silicon crystal technology, ACADEMIC PRESS. INC.

SUMMARY OF INVENTION

Technical Problem

In cutting-edge devices that use a hetero epitaxial wafer using a next-generation channel material, microscopic uniformity is also important not only macroscopic uniformity in resistivity or interstitial oxygen atom because an extremely minute pattern in a nanometer order is formed by lithography using ArF immersion or EUV. As described above, however, effective techniques have never been provided to make microscopic distribution of <111> crystal growth uniformly.

The present invention is accomplished in view of the above-described issues. It is an object of the present invention to provide a method of producing a silicon single crystal that makes it possible to produce a large diameter <111> crystal with favorable macroscopic RRG distribution (radial distribution of resistivity) and microscopic variation of resistivity.

Solution to Problem

To achieve the object described above, the present invention provides a method of producing a silicon single crystal, including pulling a silicon single crystal by Czochralski method while a magnetic field is applied to a raw material melt, comprising: setting a diameter on pulling the silicon single crystal to 300 mm or more, setting a growth axis direction of the silicon single crystal to <111>, and growing the silicon single crystal so as to satisfy a relation of $1096/D-(0.134\times M+80\times R)/D>0.7$, wherein D [mm] is the diameter on pulling the silicon single crystal, M [Gauss] is a central magnetic field strength at a surface of the raw material melt, and R [rpm] is a rotation rate of the silicon single crystal.

The crystal growth satisfying the above relation makes it possible to promote (111) lateral growth to grow 70% or more of the diameter of crystal plane by lateral growth. These conditions for promoting lateral growth makes it possible to produce a favorable large diameter <111> silicon single crystal with a diameter of 300 mm or more in which macroscopic RRG distribution is even and microscopic variation of resistivity is small.

In the method of producing a silicon single crystal of the present invention, it is preferable that the silicon single crystal be grown so as to satisfy a relation of $1096/D-(0.134\times M+80\times R)/D>1$.

This makes it possible to further promote (111) lateral growth to grow the whole plain in the crystal plain by lateral growth. Such a <111> silicon single crystal provides more favorable macroscopic RRG distribution and better microscopic variation of resistivity.

In the method of producing a silicon single crystal of the present invention, it is preferable that the diameter on pulling the silicon single crystal D be set to $Dp/\{1096-(0.134\times M+80\times R)\}$ in case of $0.7<1096/Dp-(0.134\times M+80\times R)/Dp<1$, where Dp [mm] is a diameter of a product to be collected.

Having such a diameter on pulling, a <111> crystal produced by the inventive method is allowed to provide a (111) silicon wafer with the whole plane being lateral growth portion.

In this case, it is preferable that the magnetic field applied be a horizontal magnetic field.

When the magnetic field applied is a horizontal magnetic field, the vertical convection of a silicon melt is controlled effectively, the amount of oxygen evaporated can be controlled around the crystal, and a large diameter single crystal is produced relatively easily.

The present invention also provides a (111) silicon single crystal wafer with a diameter of 300 mm or more, comprising a wafer surface 70% or more of which is composed of a (111) lateral growth portion.

Such a (111) silicon wafer provides favorable macroscopic RRG distribution, together with better microscopic variation of resistivity on the wafer surface in the lateral growth portion.

Advantageous Effects of Invention

As described above, the inventive method of producing a silicon single crystal promotes (111) lateral growth to grow 70% or more of the diameter of crystal plane by lateral growth, thereby making it possible to produce a large diameter <111> silicon single crystal with a diameter of 300 mm or more having favorable macroscopic RRG distribution and microscopic variation of resistivity. In the (111) silicon wafer obtained from a silicon single crystal produced by the method of the present invention, 70% or more of the wafer surface is composed of (111) lateral growth portion, and macroscopic RRG distribution and microscopic variation of resistivity are favorable thereby. Moreover, having (111) plane orientation, the silicon wafer like this is advantageous as a substrate for hetero epitaxial using a next-generation channel material such as Ge or a III-V group compound semiconductor, which have higher carrier mobility.

DESCRIPTION OF EMBODIMENTS

As described above, it has been demanded a method of producing a silicon single crystal that makes it possible to produce a <111> crystal with favorable macroscopic RRG distribution and microscopic variation of resistivity.

The present inventors have diligently investigated to achieve the above objects. As a result, the present inventors have found that the lateral growth occurred in the growth of <111> crystal, which has been avoided in previous arts, is strongly depend on the rotation of a crystal and the magnetic field strength; and a silicon wafer becomes uniform in plane quality under such conditions that the ratio of the diameter of a lateral growth portion to the diameter of the wafer becomes 70% or more. The present inventors also have found that the ratio of the diameter of a lateral growth portion to the diameter on pulling a crystal (hereinafter, also referred to as "diameter ratio of lateral growth") becomes 70% or more to make it possible to solve the above issues by growing a silicon single crystal so as to satisfy the relation of 1096/D−(0.134×M+80×R)/D>0.7, wherein D [mm] is the diameter on pulling the silicon single crystal, M [Gauss] is a central magnetic field strength at the surface of a raw material melt, and R [rpm] is a rotation rate of the silicon single crystal; thereby bringing the present invention to completion.

Hereinafter, the embodiments of the present invention will be described, but the present invention is not limited thereto.

<(111) Silicon Single Crystal Wafer>

The inventive (111) silicon single crystal wafer has a diameter of 300 mm or more (e.g., 300 to 450 mm), and 70% or more of the wafer surface, preferably the whole wafer surface is formed from a (111) lateral growth portion. Such a (111) silicon wafer has favorable macroscopic RRG distribution because 70% or more of the wafer diameter is a lateral growth portion. Since the lateral growth portion becomes parallel to the growth plane, the wafer surface is theoretically free from growth striation, which is caused by temperature change during growth, and microscopic variation of wafer surface is controlled.

The inventive silicon single crystal wafer has a plane orientation of (111), thereby being useful as a substrate for hetero epitaxial using a next-generation channel material such as Ge or a III-V group compound semiconductor, which have higher carrier mobility. Accordingly, they can be favorably used for a hetero structure device having a substrate for hetero epitaxial made from Si, which is full in resource as well as low cost and high quality, and a channel material such as Ge, GaAs, etc., which are poor in resource, disposed thereon. Incidentally, the inventive silicon single crystal wafer can be easily obtained by slicing of a silicon single crystal obtained by the inventive method of producing a silicon single crystal that will be described below.

<Method of Producing Silicon Single Crystal>

Figure 1:
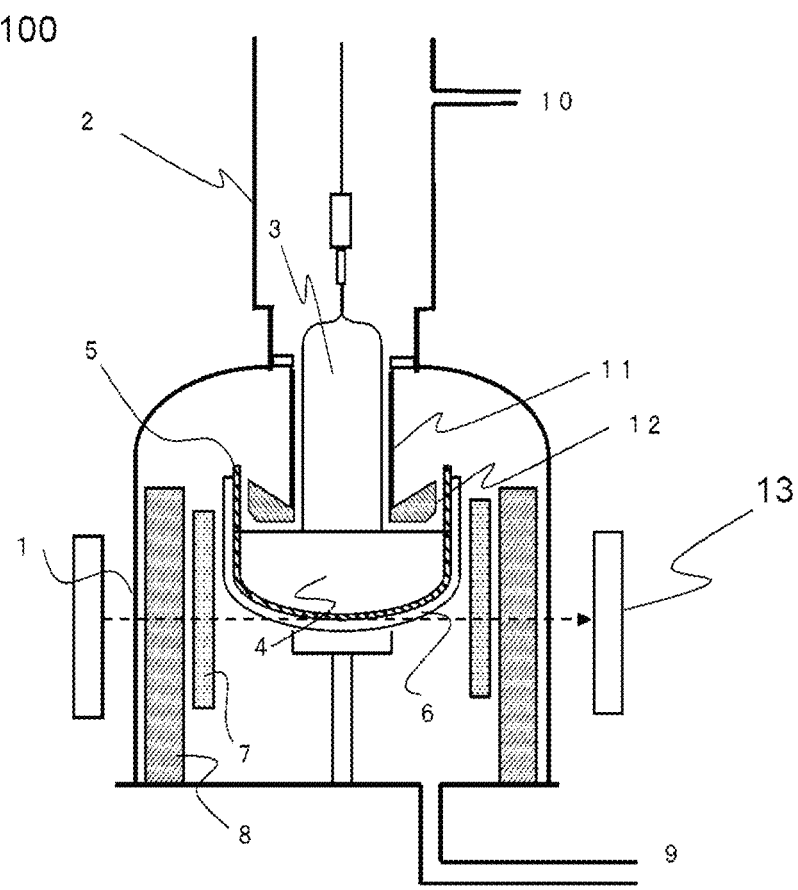
FIG. 1 is a schematic diagram showing an example of a crystal manufacturing apparatus in which the inventive method of producing a silicon single crystal can be performed.

In the first place, an example of the structure will be described by means of FIG. 1 regarding a crystal manufacturing apparatus in which the inventive method of producing a silicon single crystal can be performed. As shown in FIG. 1, the crystal manufacturing apparatus 100 is provided with the main chamber 1, together with the pulling chamber 2 which is connected to the upper part of the main chamber 1 and accommodates the grown single crystal rod (silicon single crystal) 3. In the main chamber 1, the quartz crucible 5 to accommodate the raw material melt 4 and the graphite crucible 6 to support the quartz crucible 5 are provided. Additionally, the heater 7, which is a main heat source, is disposed concentrically with the quartz crucible 5 and the graphite crucible 6. The insulation material 8 is provided outside of the heater 7. The main chamber 1 is provided with the gas outlet 9, and the pulling chamber 2 is provided the gas inlet 10 to be configured to introduce and discharge inert gas (e.g., argon gas) and so on into the main chamber 1 and the pulling chamber 2. The cylindrical gas-flow guiding cylinder 11 is provided at the upper part of the surface of the raw material melt 4 so as to surround the single crystal rod 3 in pulling. At the upper part of the melt surface of the raw material melt 4, the heat sealing members 12 are disposed oppositely. The magnetic field applying device 13 is provided at the peripheral area of the main chamber 1.

Subsequently, the inventive method of producing a silicon single crystal will be described.

In the method of producing a silicon single crystal of the present invention, for example, the crystal manufacturing apparatus 100 as shown in FIG. 1 is used, and silicon raw material is supplied to the quartz crucible 5 for preparing growth of silicon single crystal. Subsequent to heating and melting the silicon raw material, a silicon single crystal is grown while applying a magnetic field using the magnetic field applying device 13 under the conditions of setting the diameter on pulling the silicon single crystal to 300 mm or more (e.g., 300 to 450 mm) and the growth axis orientation of the silicon single crystal to <111>, thereby producing a silicon single crystal by ordinary CZ method.

In the present invention, a silicon single crystal is grown so as to satisfy the relation of 1096/D−(0.134×M+80×R)/D>0.7, wherein D [mm] is the diameter on pulling the silicon single crystal, M [Gauss] is a central magnetic field strength at the surface of a raw material melt, and R [rpm] is the rotation rate of the silicon single crystal.

Figure 2:
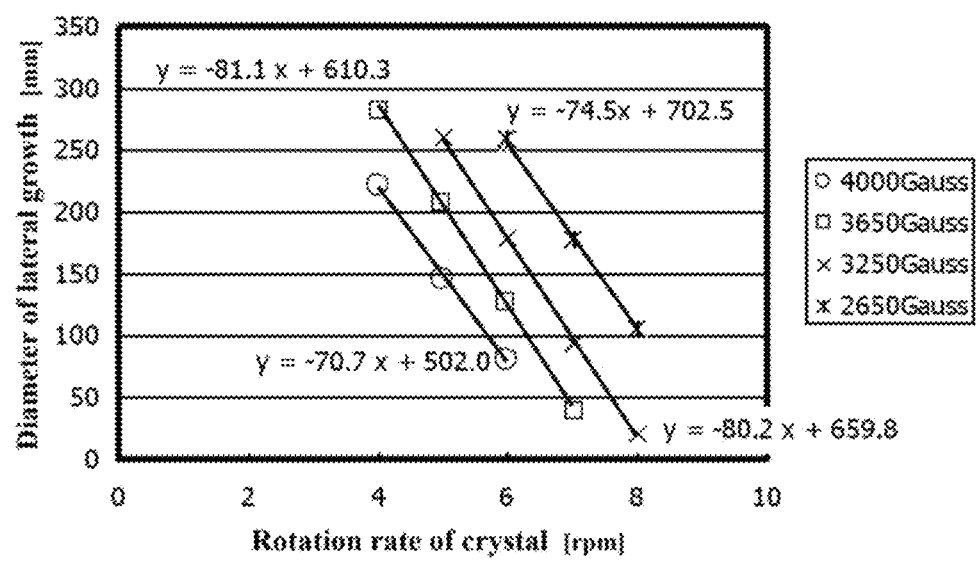
FIG. 2 is a graph in growing a <111> silicon single crystal by MCZ method with a constant central magnetic field strength at the surface of a melt, showing relations of the diameter of (111) lateral growth, the rotation rate of a crystal, and the central magnetic field strength.
Figure 3:
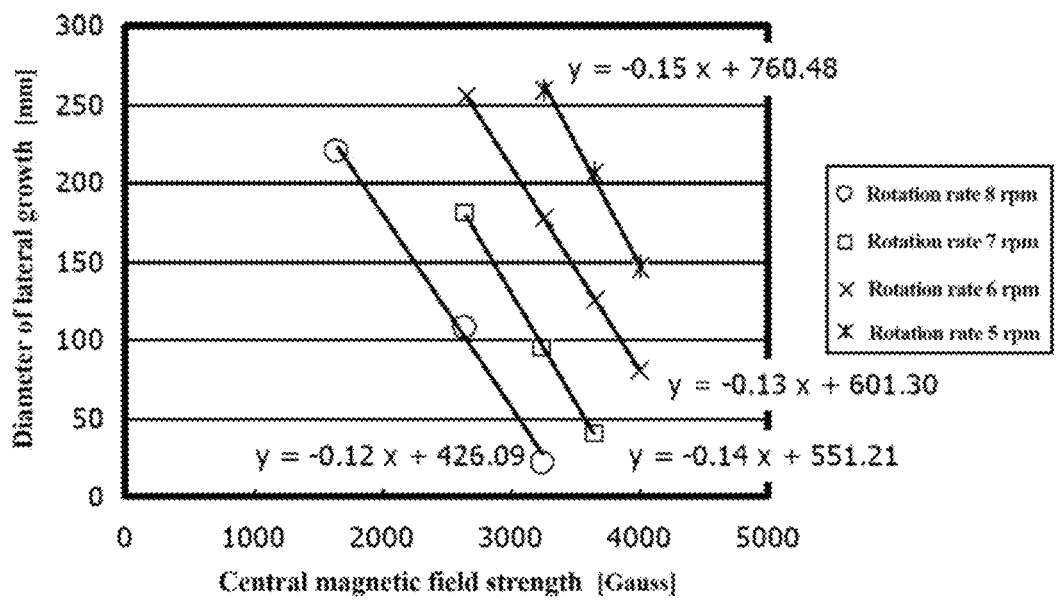
FIG. 3 is a graph in growing a <111> silicon single crystal by MCZ method with a constant rotation rate of the crystal, showing relations of the diameter of (111) lateral growth, the central magnetic field strength, and the rotation rate of a crystal.

In this relation, 1096/D−(0.134×M+80×R)/D is used as an indicator to express the diameter ratio of lateral growth. As shown in FIG. 2 and FIG. 3, the lateral growth is strongly dependent on the rotation rate of a silicon single crystal and the central magnetic field strength at the surface of a raw material melt. More specifically, the lateral growth diameter in <111> crystal growth increases as the rotation rate of a single crystal is lower and the central magnetic field strength is lower. This is probably due to melt convection and a temperature field formed by the rotation of a crystal and the magnetic field strength, which bring the melting point isotherm near the solid-liquid interface close to the (111) plane to make the lateral growth predominant. The present inventors have found that the diameter ratio of lateral growth is expressed by 1096/D−(0.134×M+80×R)/D>1 by integrating the dependences of lateral growth on the rotation rate of a crystal and on the magnetic field strength in <111> crystal growth.

More specifically, FIG. 2 shows an influence of the rotation rate of a crystal on a diameter of lateral growth with a constant central magnetic field strength of the melt surface, and FIG. 3 shows an influence of the central magnetic field strength of the melt surface on a diameter of lateral growth with a constant rotation rate of a crystal, regarding <111> crystal growth. The physical meaning of this relation shows that the melt isotherm at the solid-liquid interface is changed by the temperature distribution change of a melt due to the difference of forced convection caused by rotation of a crystal, together with the temperature distribution change of a melt due to the difference of the deterrent in natural convection caused by a magnetic field, thereby bringing the melt isotherm close to the (111) plane to make the lateral growth predominant. The diameter of lateral growth is influenced by the rotation rate of a crystal such that the diameter of lateral growth is increased by about 80 mm per 1 rpm of decrease in rotation rate, and is influenced by the magnetic field strength such that the diameter of lateral growth is increased by about 0.134 mm per 1 Gauss of decrease in magnetic field strength. These influences are integrated to 1096/D−(0.134×M+80×R)/D, which can be used as an indicator to express the diameter ratio of lateral growth.

In the method of producing a silicon single crystal of the present invention, by growing a silicon single crystal so as to satisfy the relation of 1096/D−(0.134×M+80×R)/D>0.7, it becomes possible to promote (111) lateral growth, which has been avoided in previous arts, to make the diameter ratio of lateral growth be 70% or more. By cutting out from a silicon single crystal produced by such a method, it is possible to easily obtain a (111) silicon wafer in which 70% or more of the wafer diameter is a lateral growth portion as described above. If 1096/D−(0.134×M+80×R)/D is 0.7 or less, the diameter ratio of lateral growth becomes less than 70%. In this case, macroscopic RRG distribution worsens, and growth striation occurs in the silicon single crystal to worsen microscopic variation of resistivity (see FIGS. 4 to 6 described below).

In the present invention, it is preferable to grow a silicon single crystal so as to satisfy the relation of 1096/D−(0.134×M+80×R)/D>1. This makes it possible to promote (111) lateral growth further to grow the whole plane of the crystal plane by lateral growth. Such a <111> silicon single crystal has more favorable macroscopic RRG distribution and favorable microscopic variation in resistivity. In the present invention, it is also possible to let 1096/D−(0.134×M+80×R)/D<3.5.

In the present invention, the central magnetic field strength M at the surface of a raw material melt satisfies the above relation and may be 1650 to 4000 Gauss, for example, though it is not particularly limited thereto.

The rotation rate of a silicon single crystal R can be 4 to 8 rpm, for example, though it is not particularly limited thereto.

In the present invention, in case of taking out a product with a diameter of Dp [mm] from the silicon single crystal in which 0.7<1096/Dp−(0.134×M+80×R)/Dp<1, the diameter on pulling D is preferably set to Dp/{1096−(0.134×M+80×R)}. Having such a diameter on pulling, the <111> crystal produced by the inventive method allows us to easily obtain a (111) silicon wafer in which the whole surface of the wafer is a lateral growth portion.

In the present invention for a silicon single crystal, the magnetic field applied is preferably a horizontal magnetic field. When the magnetic field applied is a horizontal magnetic field, it is possible to control vertical convection of the silicon melt effectively to control the amount of oxygen evaporated around the crystal, and to improve the efficiency in producing a single crystal with a large diameter of 300 mm or more.

EXAMPLE

Hereinafter, the present invention will be more specifically described by showing Example and Comparative Example, but the present invention is not limited thereto.

Examples and Comparative Examples

Into a quartz crucible with a diameter of 32 inches (800 mm), 360 kg of raw material is melted, applied with a horizontal magnetic field, and doped with P, whereby a <111> silicon single crystal with a diameter on pulling of 310 mm is pulled with the crystal growth rate of 0.5 mm/min. In this pulling, each rotation rate of a silicon single crystal is set to 4, 5, 6, 7, and 8 rpm; and each central magnetic field strength at the surface of the raw material melt is set to 4000, 3650, 3250, 2650, and 1650 Gauss. Each pulled crystal is ground to a cylinder with a diameter of 301 mm and then processed by PW processing. This is subjected to measurement of resistivity by four-point probe method in 1 mm pitch and oxygen precipitation treatment (650° C., 2 hr ($N_2$)+800° C., 4 hr ($N_2$)+1000° C., 16 hr ($O_2$)). Subsequently, the diameter of lateral growth in each condition is investigated by observing stripes of precipitation with an XRT apparatus. The results are shown in Table 1 and FIGS. 4 to 6.

TABLE 1

| R [rpm] | M [Gauss] | 1096/D − (0.134 × M + 80 × R)/D | Diameter of (111) lateral growth [mm] |
|---|---|---|---|
| 4 | 4000 | 0.774 | 221.3 |
|   | 3650 | 0.925 | 283.1 |
|   | 3250 | 1.098 | 300 |
|   | 2650 | 1.358 | 300 |
|   | 1650 | 1.790 | 300 |
| 5 | 4000 | 0.516 | 145 |
|   | 3650 | 0.667 | 207.9 |
|   | 3250 | 0.840 | 260.2 |
|   | 2650 | 1.100 | 300 |
|   | 1650 | 1.532 | 300 |
| 6 | 4000 | 0.258 | 80 |
|   | 3650 | 0.409 | 126.5 |
|   | 3250 | 0.582 | 178.3 |
|   | 2650 | 0.842 | 256 |
|   | 1650 | 1.274 | 300 |
| 7 | 4000 | 0.000 | 0 |
|   | 3650 | 0.151 | 40 |
|   | 3250 | 0.324 | 93.6 |
|   | 2650 | 0.584 | 180 |
|   | 1650 | 1.016 | 300 |
| 8 | 4000 | −0.258 | 0 |
|   | 3650 | −0.107 | 0 |
|   | 3250 | 0.066 | 21 |
|   | 2650 | 0.325 | 107 |
|   | 1650 | 0.758 | 220 |

Figure 4:
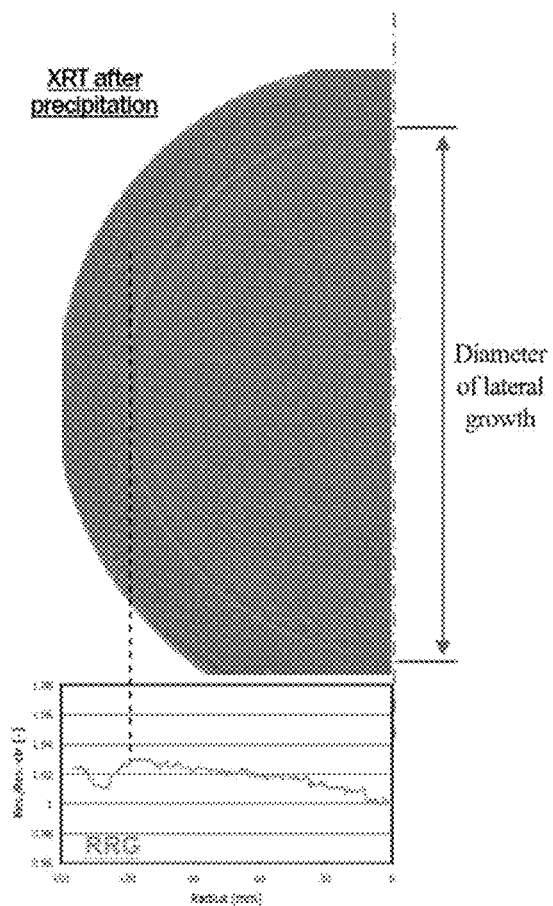
FIG. 4 is a graph showing an example of a XRT image and the radial distribution of resistivity in a lateral growth portion of a silicon single crystal produced by Example of the present invention.

FIG. 4 is a graph showing an example of a XRT image and radial distribution of resistivity in a lateral growth portion of a silicon single crystal produced by Example of the present invention. As shown in FIG. 4, the lateral growth portion did not have striation and prevented from microscopic variation of resistivity.

Figure 5:
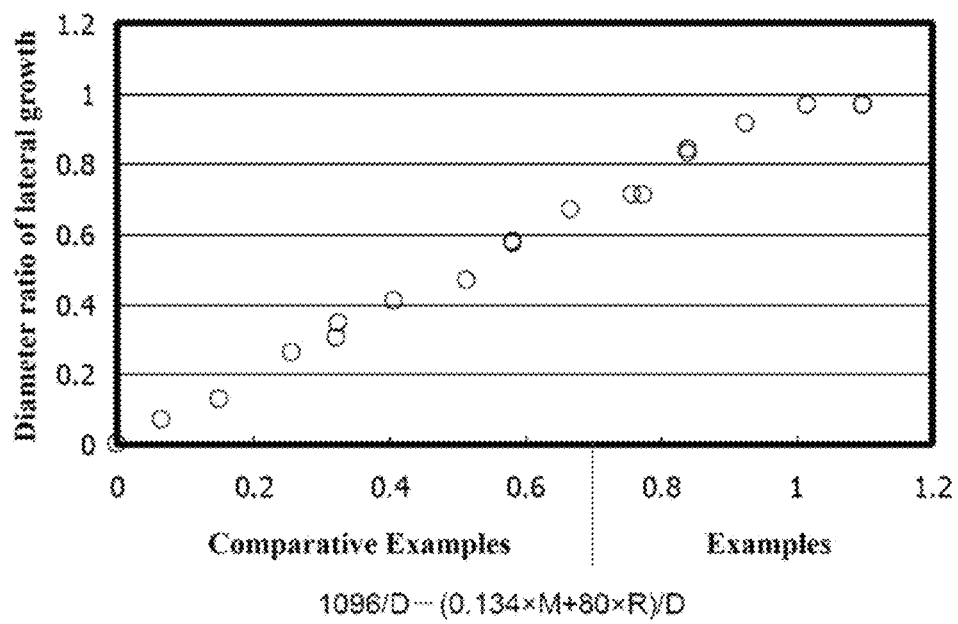
FIG. 5 is a graph of diameter ratios of lateral growth, plotted on the ordinate, and values of 1096/D−(0.134×M+80×R)/D, plotted on the abscissa, in Examples of the present invention and Comparative Examples.
Figure 6:
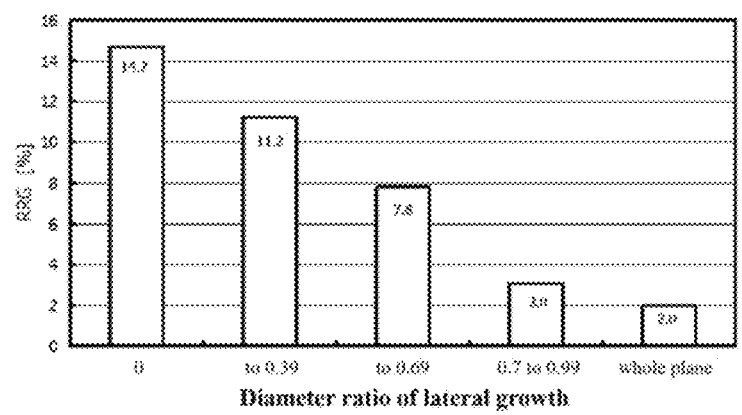
FIG. 6 is a graph showing a relation of the diameter ratio of lateral growth and the RRG distribution.

FIG. 5 is a graph of diameter ratios of lateral growth, plotted on the ordinate, and values of 1096/D−(0.134×M+80×R)/D, plotted on the abscissa, of each <111> crystal produced in Examples and Comparative Examples. FIG. 5 shows that the diameter of (111) lateral growth in pulling a <111> crystal while applying a magnetic field is controllable by the diameter D on pulling a silicon single crystal, the rotation rate R of a silicon single crystal, and the central magnetic field strength M at the surface of a raw material melt; and the ratio of the diameter of lateral growth to the diameter on pulling a crystal can be expressed by 1096/D−(0.134×M+80×R)/D. That is, each diameter ratio of lateral growth is larger than 0.7 in case of 1096/D−(0.134×M+80×R)/D>0.7 (Examples), and each diameter ratio of lateral growth is 0.7 or less in case of 1096/D−(0.134×M+80×R)/D≤0.7 (Comparative Examples). Additionally, as shown in FIG. 6, each RRG distribution showed a favorable value such as 2 to 3% when the diameter ratio of lateral growth is larger than 0.7. On the other hand, when the diameter ratio of lateral growth is 0.7 or less, each RRG distribution is worsened.

These results have shown that a <111> crystal can be produced in which the diameter ratio of lateral growth is 70% or more to achieve favorable macroscopic RRG distribution and microscopic variation of resistivity by growing a silicon single crystal so as to satisfy the relation of 1096/D−(0.134×M+80×R)/D>0.7.

As described above, the present invention produces a <111> crystal with a diameter of 300 mm or more by MCZ method in which a silicon single crystal is grown so as to satisfy the relation of 1096/D−(0.134×M+80×R)/D>0.7, wherein D [mm] is the diameter on pulling the silicon single crystal, M [Gauss] is a central magnetic field strength at the surface of a raw material melt, and R [rpm] is the rotation rate of the silicon single crystal, thereby promoting (111) lateral growth to make it possible to grow 70% or more of the diameter of crystal plane by lateral growth. In a (111) silicon wafer obtained from such a silicon single crystal, the lateral growth portion is in parallel with the growth plane, which theoretically makes it possible to remove growth striation due to temperature change during the growth from the wafer surface to control microscopic variation of the wafer surface. Moreover, these conditions for promoting the lateral growth gives favorable macroscopic RRG distribution.

Moreover, thus produced (111) silicon wafer with a large diameter of 300 mm or more can achieve microscopic uniformity of plane quality, which is important for cutting-edge devices using a next-generation channel material, and also has effect of controlling dislocation and warpage of a wafer due to the mechanical strength of (111) silicon wafer as well as effect of controlling Anti-phase domain due to the surface of diatomic layer step, thereby being advantageous as a substrate for hetero epitaxial for a next-generation channel material.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of producing a silicon single crystal, including pulling a silicon single crystal by Czochralski method while a magnetic field is applied to a raw material melt, comprising:
    setting a diameter on pulling the silicon single crystal to 300 mm or more,
    setting a growth axis direction of the silicon single crystal to <111>, and
    growing the silicon single crystal so as to satisfy a relation of 1096/D−(0.134×M+80×R)/D >0.7, wherein D [mm] is the diameter on pulling the silicon single crystal, M [Gauss] is a central magnetic field strength at a surface of the raw material melt, and R [rpm] is a rotation rate of the silicon single crystal.

2. The method of producing a silicon single crystal according to claim 1, wherein the silicon single crystal is grown so as to satisfy a relation of 1096/D−(0.134×M+80×R)/D >1.

3. The method of producing a silicon single crystal according to claim 1, wherein the magnetic field applied is a horizontal magnetic field.

4. The method of producing a silicon single crystal according to claim 2, wherein the magnetic field applied is a horizontal magnetic field.

* * * * *